(12) United States Patent
Sautter et al.

(10) Patent No.: US 11,818,849 B1
(45) Date of Patent: Nov. 14, 2023

(54) INCREASING ADHESION OF METAL-ORGANIC INTERFACES BY SILANE VAPOR TREATMENT

(71) Applicant: Yield Engineering Systems, Inc., Fremont, CA (US)

(72) Inventors: Kenneth Sautter, Fremont, CA (US); Syndee Young, San Jose, CA (US); Charudatta Galande, Fremont, CA (US)

(73) Assignee: YIELD ENGINEERING SYSTEMS, INC., Fremont, CA (US)

( * ) Notice: Subject to any disclaimer, the term of this patent is extended or adjusted under 35 U.S.C. 154(b) by 0 days.

(21) Appl. No.: 18/137,876

(22) Filed: Apr. 21, 2023

(51) Int. Cl.
  *H05K 3/38* (2006.01)
  *H05K 3/42* (2006.01)
  *H05K 3/14* (2006.01)

(52) U.S. Cl.
  CPC ............ *H05K 3/389* (2013.01); *H05K 3/146* (2013.01); *H05K 3/382* (2013.01); *H05K 3/386* (2013.01); *H05K 3/42* (2013.01); *Y10T 29/49155* (2015.01)

(58) Field of Classification Search
  CPC .......... H05K 3/38; H05K 3/382; H05K 3/386; H05K 3/389; Y10T 29/49155
  See application file for complete search history.

(56) References Cited

U.S. PATENT DOCUMENTS

| | | | |
|---|---|---|---|
| 4,639,285 A * | 1/1987 | Suzuki | H05K 3/381 156/329 |
| 6,623,844 B2 * | 9/2003 | Nishimoto | H05K 3/4617 428/209 |
| 6,767,828 B2 * | 7/2004 | Andry | H01L 28/60 257/E21.174 |
| 7,557,369 B2 * | 7/2009 | Humbs | H10K 59/12 257/E39.007 |
| 8,314,340 B2 | 11/2012 | Akai et al. | |
| 8,361,548 B2 * | 1/2013 | Moffat | B05D 1/60 427/314 |
| 8,436,252 B2 | 5/2013 | Kawano et al. | |
| 8,633,400 B2 | 1/2014 | Akai et al. | |
| 9,362,231 B2 | 6/2016 | Chiang et al. | |
| 9,955,583 B2 | 4/2018 | Ishii et al. | |

(Continued)

FOREIGN PATENT DOCUMENTS

| EP | 2244542 B1 | 3/2013 |
|---|---|---|
| JP | 2006080473 A | 3/2006 |

OTHER PUBLICATIONS

Silane Coupling Agents: Connecting Across Boundaries (3rd Edition) by Barry Arkles, Annalese Maddox, Mani Singh, Joel Zazyczny, and Janis Matisons, Copyright 2014, Gelest, Inc. • Morrisville, PA., pp. 1-76.

(Continued)

*Primary Examiner* — Peter Dungba Vo
*Assistant Examiner* — Joshua D Anderson
(74) *Attorney, Agent, or Firm* — Finnegan, Henderson, Farabow, Garrett & Dunner, LLP

(57) ABSTRACT

A method of improving the adhesion of a metal-organic interface in an electronic device includes providing a substrate with a metal structure, depositing a mono-layer of a selected silane composition on a surface of the metal structure with a vapor of the selected silane composition, and coating the treated surface with an organic material.

20 Claims, 5 Drawing Sheets

(56) References Cited

U.S. PATENT DOCUMENTS

| | | |
|---|---|---|
| 10,123,433 B2 | 11/2018 | Moriyama et al. |
| 2004/0112755 A1 | 6/2004 | Czeczka et al. |
| 2006/0032329 A1 | 2/2006 | Rubenstein et al. |
| 2006/0093838 A1* | 5/2006 | Kohayashi ............ C23C 28/36 427/248.1 |
| 2006/0254502 A1 | 11/2006 | Garrou et al. |
| 2007/0023908 A1 | 2/2007 | Fork et al. |
| 2008/0113178 A1 | 5/2008 | Lazovsky |
| 2009/0305226 A1 | 12/2009 | Sinesky et al. |
| 2010/0113264 A1 | 5/2010 | Tsurumi et al. |
| 2011/0168430 A1* | 7/2011 | Hata ..................... H05K 3/389 174/126.1 |
| 2011/0197369 A1 | 8/2011 | Hinestroza et al. |
| 2011/0197782 A1 | 8/2011 | Wang et al. |
| 2011/0252580 A1 | 10/2011 | Miller et al. |
| 2012/0037312 A1 | 2/2012 | Sparing et al. |
| 2014/0370313 A1 | 12/2014 | Thomas et al. |
| 2021/0111025 A1 | 4/2021 | Zyulkov et al. |

OTHER PUBLICATIONS

Improvement of the Adhesion Strength Between Copper Plated Layer and Resin Substrate Using a Chemically Adsorbed Monolayer by K. Tsuchiya, T. Ohtake, and K. Ogawa, Owned by the authors, published by EDP Scient, 2013, MATEC Web of Conferences 4, 05004 (2013), DOI: 10.1051/mateconf/20130405004 , 4 pages.

Improvements of the Epoxy-Copper Adhesion for Microelectronic Application by Lerys Granado, Stefan Kempa, Laurence John Gregoriades, Frank Burning, Tobias Bernhard, Valerie Flaud, Erick Ahnglaret, and Nicole Frety, ResearchGate: http://www.researchgate.net/publication/334228540, Article in ACS Applied Electronic Materials, Jul. 2019, DOI: 10.1021/acsaelm.9b00290, 23 pages.

* cited by examiner

INCREASING ADHESION OF METAL-ORGANIC INTERFACES BY SILANE VAPOR TREATMENT

TECHNICAL FIELD

The present disclosure relates to a method of improving the adhesion strength of metal-organic interfaces in an electronic device.

BACKGROUND

The fabrication process of electronic (or photonic) devices is composed of many sequential steps to produce circuits on a wafer or a panel (collectively referred to herein as a substrate) of a material (e.g., semiconductor wafers, glass panels, printed circuit board, organic/ceramic substrates, etc.). Defects of any source introduced during the fabrication process reduces yield of the resulting devices. One cause of defects results from inadequate adhesion at metal-organic interfaces of the device. An electronic device (e.g., package substrate, integrated circuit chip, optoelectronic devices, etc.) includes numerous metal-organic interfaces. Adhesion between the metal component (e.g., interconnect, landing pad, via, etc.) and the organic component (e.g., dielectric material, molding compound, underfill material, etc.) at a metal-organic interface may be compromised for many reasons. For example, the quality/structure of the materials at the interface, embedded particles/residue on the interface (debris, chemicals, etc.), high thermo-mechanical interfacial forces (e.g., due to CTE mismatch), etc. Poor adhesion between the metal (e.g., copper pad) and the organic (e.g., dielectric) at an interface may introduce defects (e.g., delamination, cracks, etc.) at the interface and lead to reduced yield and/or reliability of the device. A strong metal-organic interface ensures that downstream processes (e.g., chemicals and/or process conditions used during downstream processes) do not deteriorate the adhesion strength of interface. Moreover, miniaturization of electronic devices requires miniaturization of integrated-circuit (IC) substrates (e.g., Printed Circuit Board (PCB)) consisting of layers of organic material (commonly referred to as build-up layers or dielectric layers comprising, for example, polymers, build up layers, e.g., Ajinomoto Build-up Film (ABF), etc.) and metal (e.g., copper) interconnect circuitry (e.g., lines, planes, vias, etc.). To manufacture very fine copper circuitry with small line and space widths for next generation electronic devices, the adhesion between the copper and dielectric layer needs to be increased.

Current adhesion improvement methods rely on surface roughening a metal surface to allow an overlapping dielectric layer to mechanically interlock with the metal surface and improve adhesion. For example, the surface of the metal interconnect is modified by, for example, etching, plasma ablation, etc. prior to depositing the dielectric layer to improve the adhesion between the metal and dielectric. However, such surface roughening may detrimentally affect the electrical performance of the electronic device and/or result in reliability issues. For example, high-frequency applications may require a low surface roughness, etching/ablation may require additional cleaning steps and/or cause debris from the roughening process to redeposit and be embedded on the interface. The methods of improving adhesion of the current disclosure may alleviate at least some of the above-described deficiencies. However, the scope of the current disclosure is defined by the claims and not by the ability to solve any problem.

SUMMARY

Embodiments of a method for improving the interfacial strength of metal-organic interfaces of an electronic device are disclosed. In some embodiments, a method of improving the adhesion of a metal-organic interface in an electronic device includes providing a substrate with a metal structure. The method may also include depositing a mono-layer of a selected silane composition on a surface of the metal structure with a vapor of the selected silane composition, and coating the treated surface with an organic material.

In one embodiments, a method of improving the adhesion of a metal-organic interface in an electronic device is disclosed. The method may include providing a substrate with a copper interconnect structure and depositing a mono-layer of a silane composition on a surface of the copper interconnect structure by vapor phase deposition. The silane composition may include (a) at least a primary amine group or a secondary amine group and at least one alkoxysilyl group, (b) the alkoxysilyl group may be one of ethoxy, methoxy, butoxy, propoxy, or isopropoxy, (c) the alkoxysilyl group may have between one and three alkoxy groups attached, and (d) a boiling point below about 250° C. at a pressure between about 0.1-10 Torr. The method may further include depositing ABF on the surface of the copper interconnect structure after depositing the mono-layer of the silane composition.

In another embodiment, a method of improving the adhesion of a metal-organic interface in an electronic device is disclosed. The method may include providing a substrate with a metal structure formed thereon, and treating a surface of the metal structure with a vapor of a silane composition. The silane composition may include at least one of (i.)N-(2-Aminoethyl)-3-aminopropyltrimethoxysilane (AE-APTMS), (ii.) N,N'-Bis[(3-trimethoxysilyl)propyl]ethylenediamine (TMSP-ED), (iii.) Bis(3-Trimethoxysilylpropyl)amine, (TMSPA), (iv.) 3-Mercaptopropyltrimethoxysilane (MPTMS), (v.)N-(2-Aminoethyl)-3-aminopropylsilanetriol, 25% in water (AE-APST), (vi.) 3-Thiocyanatopropyltriethoxysilane, 92% (TCPTES), (vii.)N-(6-Aminohexyl)aminomethyl trimethoxysilane, (viii.) 1,3-Bis(3-aminopropyl)tetramethyldisiloxane, (ix.) Bis[3-(triethoxysilyl)propyl]disulfide, 90% (TESPDS), (x.) Cysteamine, (xi.) 3-Aminopropanethiol, (xii.) Aminoethylaminopropyl/methylsilsesquioxane, in aqueous solution, (xiii.) Aminopropylsilsesquioxane in aqueous solution (APS), (xiv.) (2-Diethylphosphatoethyltriethoxysilane), (xv.) (2-Diethylphosphatoethyl)methyldiethoxysilane, (xvi.) N-(2-Aminoethyl)-3-Aminopropyltriethoxysilane, (xvii.) (3-(M-AMINOPHENOXY)PROPYLTRIMETHOXYSILANE, (xviii.)N-(2-Aminoethyl)-3-Aminopropylmethyldimethoxysilane, (xix.)N-(2-Aminoethyl)-3-Aminoisobutyl-methyldimethoxysilane, (xx.)N-(2-Aminoethyl)-3-Aminoisobutyldimethylmethoxysilane, (xxi.) 4-Aminobutyltriethoxysilane, (xxii.) (Aminoethylaminomethyl)Phenethyltrimethoxysilane, (xxiii.)N-(2-Aminoethyl)-3-Aminopropylmethyldiethoxysilane, (xxiv.)N-(2-Aminoethyl)-11-Aminoundecyltrimethoxysilane, (xxv.)N-(6-Aminohexyl)Aminopropyltrimethoxysilane, (xxvi.)N-(6-Aminohexyl)Aminopropyltrimethoxysilane, (xxvii.) m-AMINOPHENYLTRIMETHOXYSILANE, or (xxviii.) m-AMINOPHENYLTRIMETHOXYSILANE. The method may also include after treating the surface, coating the treated surface with an organic material.

In yet another embodiment, a method of improving the adhesion of a metal-organic interface in an electronic device is disclosed. The method may include providing a substrate with a copper interconnect structure and treating a surface of the copper interconnect structure with a vapor of a silane composition. The silane composition may have a boiling point below about 250° C. at a pressure between about 0.1-10 Torr and include at least one of (i.)N-(2-Aminoethyl)-3-aminopropyltrimethoxysilane (AE-APTMS), (ii.) N,N'-Bis[(3-trimethoxysilyl)propyl]ethylenediamine (TMSP-ED), (iii.) Bis(3-Trimethoxysilylpropyl)amine, (TMSPA), (iv.) 3-Mercaptopropyltrimethoxysilane (MPTMS), (v.)N-(2-Aminoethyl)-3-aminopropylsilanetriol, 25% in water (AE-APST), (vi.) 3-Thiocyanatopropyltriethoxysilane, 92% (TCPTES), (vii.)N-(6-Aminohexyl)aminomethyl trimethoxysilane, (viii.) 1,3-Bis(3-aminopropyl)tetramethyldisiloxane, (ix.) Bis[3-(triethoxysilyl)propyl]disulfide, 90% (TESPDS), (x.) Cysteamine, (xi.) 3-Aminopropanethiol, (xii.) Aminoethylaminopropyl/methylsilsesquioxane, in aqueous solution, (xiii.) Aminopropylsilsesquioxane in aqueous solution (APS), (xiv.) (2-Diethylphosphatoethyltriethoxysilane), (xv.) (2-Diethylphosphatoethyl)methyldiethoxysilane, (xvi.) N-(2-Aminoethyl)-3-Aminopropyltriethoxysilane, (xvii.) (3-(M-AMINOPHENOXY)PROPYLTRIMETHOXYSILANE, (xviii.)N-(2-Aminoethyl)-3-Aminopropylmethyldimethoxysilane, (xix.) N-(2-Aminoethyl)-3-Aminoisobutylmethyldimethoxysilane, (xx.)N-(2-Aminoethyl)-3-Aminoisobutyldimethylmethoxysilane, (xxi.) 4-Aminobutyltriethoxysilane, (xxii.) (Aminoethylaminomethyl)Phenethyltrimethoxysilane, (xxiii.)N-(2-Aminoethyl)-3-Aminopropylmethyldiethoxysilane, (xxiv.)N-(2-Aminoethyl)-11-Aminoundecyltrimethoxysilane, (xxv.)N-(6-Aminohexyl)Aminopropyltrimethoxysilane, (xxvi.)N-(6-Aminohexyl)Aminopropyltrimethoxysilane, (xxvii.) m-AMINOPHENYLTRIMETHOXYSILANE, or (xxviii.) m-AMINOPHENYLTRIMETHOXYSILANE. The method may also include after treating the surface, coating the treated surface with ABF.

BRIEF DESCRIPTION OF THE DRAWINGS

The accompanying drawings, which are incorporated herein and constitute a part of this disclosure, illustrate exemplary embodiments and, together with the description, are used to explain the disclosed principles. In these drawings, where appropriate, reference numerals that illustrate the same or similar structures, components, materials, and/or elements in different figures are labeled similarly. It is understood that various combinations of the structures, components, and/or elements, other than those specifically shown, are contemplated and are within the scope of the present disclosure.

For simplicity and clarity of illustration, the figures depict the general structure of the various described embodiments. Details of well-known components or features may be omitted to avoid obscuring other features, since these omitted features are well-known to those of ordinary skill in the art. Further, features in the figures are not necessarily drawn to scale. The dimensions of some features may be exaggerated relative to other features (for example, see FIG. 3B) to improve understanding of the exemplary embodiments. One skilled in the art would appreciate that the features in the figures are not necessarily drawn to scale and, unless indicated otherwise, should not be viewed as representing dimensions or proportional relationships between different features in a figure. Additionally, even if it is not expressly mentioned, aspects described with reference to one embodiment or figure may also be applicable to, and may be used with, other embodiments or figures.

DETAILED DESCRIPTION

All relative terms such as "about," "substantially," "approximately," etc., indicate a possible variation of ±10% (unless noted otherwise or another degree of variation is specified). For example, a feature disclosed as being about "t" units thick (or length, width, depth, etc.) may vary in thickness from (t−0.1t) to (t+0.1t) units. In some cases, the specification also provides context to some of the relative terms used. For example, a structure (e.g., a coating edge) described as being substantially flat may deviate by ±10% from being perfectly flat. Further, a range described as varying from, or between, 5 to 10 (5-10), includes the endpoints (i.e., 5 and 10). Moreover, as used herein, a composition that includes at least one of A, B, or C is used to refer to a composition that includes one or more of A, B, or C. For example, a composition that includes only A, a composition that includes only B, a composition that includes only C, a composition that includes both A and B, a composition that includes both A and C, a composition that includes A, B, and C, etc.

Unless otherwise defined, all terms of art, notations, and other scientific terms or terminology used herein have the same meaning as commonly understood by persons of ordinary skill in the art to which this disclosure belongs. Some components, structures, and/or processes described or referenced herein are well understood and commonly employed using conventional methodology by those skilled in the art. These components, structures, and processes will not be described in detail. All patents, applications, published applications and other publications referred to herein as being incorporated by reference are incorporated by reference in their entirety. If a definition or description set forth in this disclosure is contrary to, or otherwise inconsistent with, a definition and/or description in these references, the definition and/or description set forth in this disclosure controls over those in references incorporated by reference. None of the references described or referenced herein is admitted as prior art relative to the current disclosure. It should be noted that, in this disclosure, the term "electronic device" is used to cover all components and electronic/photonic assemblies (e.g., package substrate, printed circuit board, interposer, integrated circuit chip, etc.).

Figure 1A:
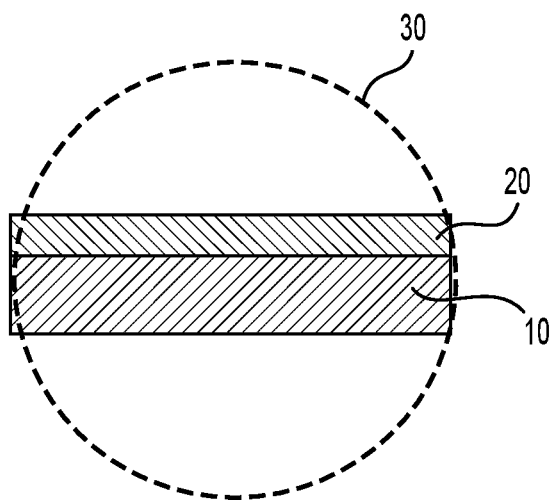
FIG. 1A is a simplified schematic illustration of a metal-organic interface in an electronic device.

The discussion below describes an exemplary method to improve the interfacial adhesion strength of a metal-organic interface in an electronic device. FIG. 1A is a simplified representation of a metal-organic interface 30 of an exemplary electronic device illustrated in FIG. 1B. Interface 30 includes a metal structure 10 (e.g., line, plane, pad, via wall, etc.) with an organic layer 20 formed on one of its surfaces. Organic layer 20 may be formed on metal structure 10 by any known method used in the fabrication of electronic devices (e.g., deposition, plating, growing, spraying, etc.). In an exemplary embodiment, metal-organic interface 30 of FIG. 1A may an interface of an exemplary package substrate 40 that represents the electronic device of FIG. 1B. Packaged substrate 40 is an 8 layer High Density Interconnect (HDI) substrate with two build-up layers 34 on each side of core stack 32 having 4 circuit layers (referred to as a 2+4+2 (2 build-up+4 core layers+2 build-up layers) stack). The core stack 32 may be made of a BT (bismaleimide triazine) epoxy with embedded glass fibers that separate the copper interconnect lines and plated through hole (PTH) vias of the core. The build-up layers 34 on either side of the core stack 32 may also include an organic dielectric material (such as ABF) that separate the copper interconnect structures (e.g., interconnect lines, inter-layer vias, bond pads, etc.) in these layers. In some embodiments, the BT epoxy core stack 32 may be fabricated first and then build-up layers 34 may be sequentially formed (e.g., by depositing, photo-lithographic patterning, etching, etc.) and on the top and bottom. As illustrated by the dashed line circles in FIGS. 1A and 1B, the metal-organic interface 30 of FIG. 1A may be an interface located anywhere on package substrate 40. Although interface 30 is described as being part of a package substrate 40, as explained previously, the interface 30 can be a part of any electronic device. For example, on the back end structure of an IC die, etc.

Figure 1B:
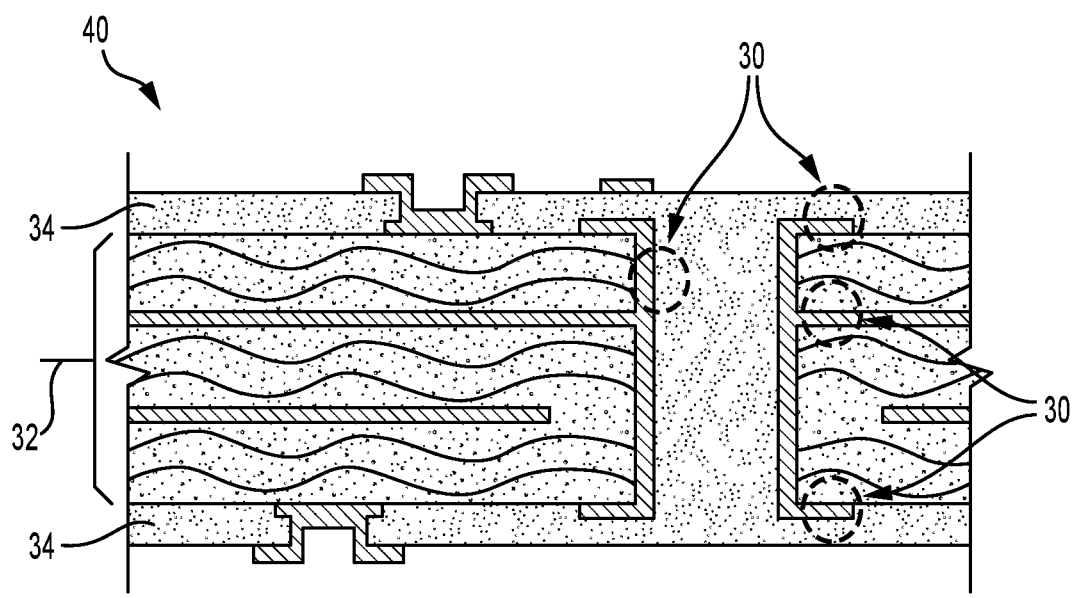
FIG. 1B is a schematic cross-sectional view of an exemplary electronic device that includes the interface of FIG. 1A.

In the embodiment illustrated in FIGS. 1A and 1B, the material of metal structure 10 is the electrically conductive interconnect material (e.g., copper, etc.). The material of organic layer 20 depends on the location of interface 30 in package substrate 40. For example, if interface 30 is an interface in the core stack 32, organic layer 20 may be an organic material used in the core (e.g., BT epoxy, etc.). And if interface 30 is an interface in a build-up layer 34, organic layer 20 may be an organic material used in the build-up layer (e.g., ABF, or any other build-up material etc.). These materials are only exemplary. In general, organic layer 20 may include any material such as, for example, polymer, dielectric, epoxy (e.g., underfill epoxy, over mold epoxy, etc.), or a composite material consisting of two or more of the above materials. For example, a composite of glass fiber, epoxy resign and silica filler material with a layer of copper on top, commonly called copper clad laminate, etc. And, metal structure 10 may include any metal or alloy, such as, for example, copper, gold, titanium, aluminum, etc. Moreover, metal structure 10 of interface 30 may be any portion of the interconnect structure (e.g., interconnect line, power plane, ground plane, inter-layer via, PTH, bond pad, etc.) on package substrate 40.

With reference to FIG. 1A, in the methods of the current disclosure, after the metal structure 10 is formed by any suitable method, prior to forming the organic layer 20 on a surface of the metal structure 10 (e.g., by depositing a layer of the organic material), a thin layer (e.g., a mono-layer) of a suitable silane is formed (e.g., deposited) on the surface of the metal structure 10 to increase the adhesion of the organic layer 20 on the metal structure 10. Metal structure 10 may be formed by any process (e.g., IC fabrication process) used to form metal structures on an underlying substrate. For example, one exemplary process of forming metal structure 10 on an underlying substrate (e.g., core stack 32 of FIG. 1B) may include depositing (e.g., by chemical vapor deposition (CVD), etc.) a layer of a metal (e.g., copper) on the substrate and patterning the metal layer into the desired circuit pattern using conventional photolithographic processes. The organic layer 20 may also be formed atop the metal structure 10 by any known process (e.g., deposition, plating, spraying, etc.) used in the fabrication of package substrate 40. Prior to forming the organic layer 20, a silane mono-layer is formed (e.g., deposited) on the surface of the metal structure, for example, by vapor phase silane deposition. In general, the deposited silane mono-layer may be about 1-30 Angstroms thick. In some embodiments, the silane mono-layer may be between about 1-10 Angstroms thick. It should be noted that that the "thickness" of a mono-layer may be the length of the silane molecule. The coverage of the mono-layer on the substrate may not be 100% and if a measurement technique such as ellipsometry is used to measure the "thickness" of such a film, the derived thickness may be between 0-100% of the length of the molecule, depending on the percentage coverage of the mono-layer on the substrate.

Vapor phase silane deposition is a controlled process that provides a stable environment for forming a uniform self-assembled mono-layer silane coating on the surface of the metal structure 10. Functionalized silane mono-layer coatings provide reactivity and functionality to the surface of the metal structure 10 by creating a durable and covalent bond between the silane molecules and the underlying metal structure 10. As known to persons skilled in the art, the physical and chemical properties of a solid surface are largely determined by the outmost layer of atoms or chemical groups. As a result, coating the surface of metal structure 10 with a suitable silane mono-layer allows the metal structure 10 to form a strong bond with the molecules of the organic layer 20 that will be deposited (or otherwise formed) thereon. Although silane surface modification of metal surfaces is known (see, e.g., Sagiv; J. Am. Chem. Soc.; Jan. 1, 1980; 102; pp. 92-98), successful silane coupling agents for metals that form hydrolytically or mechanically unstable surfaces oxides were not previously disclosed. Suitable silane coupling agents for bonding between a metal surface and an organic layer have also not been previously disclosed.

Suitable silane coupling agents to increase the adhesion strength of metal-organic interfaces may include a class of aminosilanes with at least one primary or secondary amine group, and at least one alkoxysilyl group. The alkoxysilyl group may be one of—ethoxy, methoxy, butoxy, propoxy, or isopropoxy. And, the alkoxysilyl group may have between one and three alkoxy groups attached. Suitable silane coupling agents of the current disclosure may also include a class of thiol containing silanes including at least one thiol (S-H) group and at least one alkoxysilyl group. Suitable silane coupling agents of the current disclosure may further include a class of thiocyanate containing silanes having at least one thiocyanate group (S-N) and at least one alkoxysilyl group. In some embodiments, the selected silane composition may have a boiling point below about 250° C. at a pressure between about 0.1-10 Torr.

Table 1 lists some of the silane compositions that may be used as effective coupling agents for metal-organic interfaces (interface 30 of FIG. 1A). These compositions may be especially suitable to increase the adhesion of organic build-up materials (such as, for example, ABF) to surfaces of metal structures 10 formed by different processes, such as, for example, electroless copper, physical vapor deposited (PVD) Copper, electroplated copper, electroplated gold, PVD gold, etc. It should be noted that the list in Table 1 is not an exhaustive list and suitable silane compositions of the current disclosure may include any composition from the class of aminosilanes, thiol containing silanes, or thiocyanate containing silanes described above. Furthermore, in some embodiments, the selected silane composition may have a boiling point below about 250° C. at a pressure between about 0.1-10 Torr.

TABLE 1

Exemplary silane chemistries

| | | |
|---|---|---|
| 1 | N-(2-Aminoethyl)-3-aminopropyl-trimethoxysilane (AE-APTMS), CAS# [1760-24-3] | |
| 2 | N,N'-Bis[(3-trimethoxysilyl)propyl]ethylenediamine (TMSP-ED), CAS# [68845-16-9] | |
| 3 | Bis(3-Trimethoxysilyl-propyl)amine, (TMSPA) CAS# [82985-35-1] | |
| 4 | 3-Mercaptopropyl-trimethoxysilane (MPTMS), CAS# [4420-74-0] | |
| 5 | N-(2-Aminoethyl)-3-aminopropylsilanetriol, 25% in water (AE-APST), CAS# [68400-09-9] | |
| 6 | 3-Thiocyanato-propyltriethoxysilane, 92% (TCPTES), CAS# [34708-08-2] | |
| 7 | N-(6-Aminohexyl) aminomethyl trimethoxysilane, CAS# [15129-36-9] | |
| 8 | N-(6-Aminohexyl) aminopropyl trimethoxysilane, CAS # [51895-58-0] | |
| 9 | 1,3-Bis(3-aminopropyl) tetramethyldisiloxane, CAS # [2469-55-8] | |

TABLE 1-continued

Exemplary silane chemistries

| | | |
|---|---|---|
| 10 | Bis[3-(triethoxysilyl)propyl]disulfide, 90% (TESPDS), CAS# [56706-10-6] | 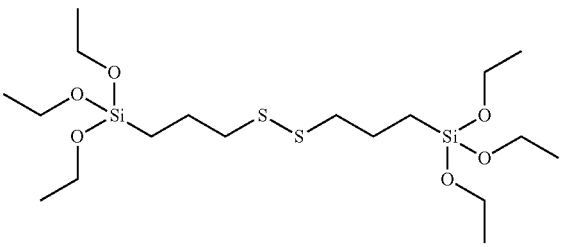 [SMILES: CCO[Si](CCCSSCCC[Si](OCC)(OCC)OCC)(OCC)OCC] |
| 11 | Cysteamine, CAS# [51-85-4] | 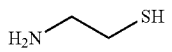 |
| 12 | 3-Aminopropanethiol, CAS# [462-47-5] | 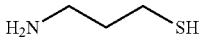 |
| 13 | Aminoethylaminopropyl/methylsilsesquioxane, in aqueous solution (AEAPMS) | 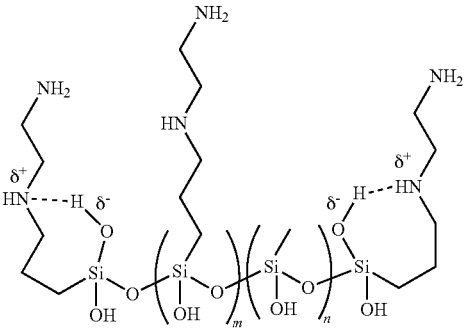 |
| 14 | Aminopropyl-silsesquioxane in aqueous solution (APS) | 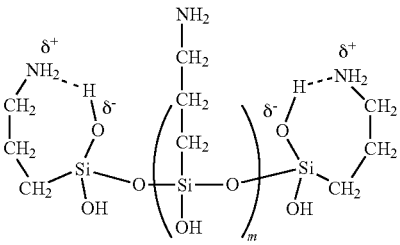 |
| 15 | (2-Diethyl-phosphatoethyl-triethoxysilane), CAS # 757-44-8 | 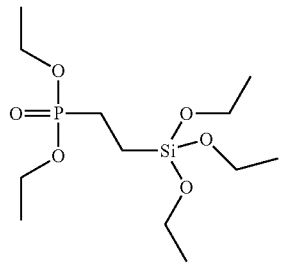 [SMILES: CCO[Si](CCP(=O)(OCC)OCC)(OCC)OCC] |
| 16 | (2-Diethyl-phosphatoethyl)methyldiethoxy silane, CAS # SID3411.0 | 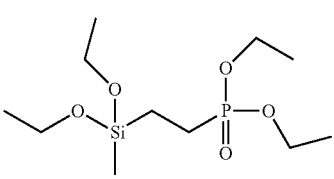 [SMILES: CCO[Si](C)(CCP(=O)(OCC)OCC)OCC] |
| 17 | N-(2-Aminoethyl)-3-Aminopropyl-triethoxysilane | 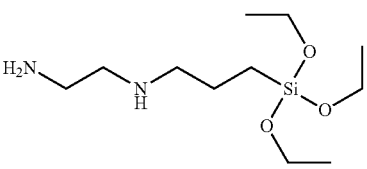 [SMILES: CCO[Si](CCCNCCN)(OCC)OCC] |

TABLE 1-continued

Exemplary silane chemistries

| | | |
|---|---|---|
| 18 | 3-(M-AMINOPHENOXY) PROPYLTRI-METHOXYSILANE | |
| 19 | N-(2-Aminoethyl)-3-Aminopropylmethyl-dimethoxysilane | |
| 20 | N-(2-Aminoethyl)-3-Aminoisobutylmethyl-dimethoxysilane | |
| 21 | N-(2-Aminoethyl)-3-Aminoisobutyldimethyl-methoxysilane | |
| 22 | 4-Aminobutyl-triethoxysilane | |
| 23 | (Aminoethyl-aminomethyl) Phenethyltri-methoxysilane | |
| 24 | N-(2-Aminoethyl)-3-Aminopropyl-methyldiethoxysilane | |
| 25 | N-(2-Aminoethyl)-11-Aminoundecyl-trimethoxysilane | |

TABLE 1-continued

Exemplary silane chemistries

| | | |
|---|---|---|
| 26 | N-(6-Aminohexyl)Aminopropyl-trimethoxysilane | |
| 27 | N-(6-Aminohexyl)Aminopropyl-trimethoxysilane | |
| 28 | m-AMINOPHENYL-TRIMETHOXYSILANE | |
| 29 | p-AMINOPHENYL-TRIMETHOXYSILANE | |

It was determined that treating the surfaces of the metal structures 10 using a vapor of at least one of the above-described silane chemistries (e.g., by depositing a mono-layer of the silane composition by vapor phase silane deposition) prior to forming the organic layer 20 thereon increases the adhesion strength of the interface 30. In vapor phase the process works with individual molecules and forms ultrathin mono-layer coatings on the metal structure 10. The above-described silane chemistries (including those listed in Table 1) have been selected such that they will not react head to tail and therefore will not polymerize and form thick layers. With some chemistries, in liquid phase, the chemicals may have a tendency to clump together and form uneven layers. Vapor phase deposition has the additional benefit of being able to diffuse through small openings as device features reduce in size.

The chemistry of the silane composition selected for any particular application depends on the materials that form the interface, process conditions, etc. For example, the materials that constitute the metal structure 10 and organic layer 20, the process conditions, etc. It was determined that these silane chemistries are effective to improve the adhesion of both smooth and rough surfaces and provide good post deposition film stability. Although the disclosed silane chemistries or compositions are expected to be suitable for a wide variety of materials used as metal structures 10 and organic layers 20 in electronic devices, they were determined to be especially effective for increasing the adhesion between organic layers 20 comprising ABF and silicon nitride and metal structures 10 comprising copper. These silane chemistries are also expected to be effective to increase the adhesion strength between any metal with an unstable oxide and a polyamide. It is believed that the functionalized and reactive groups of the disclosed silane chemistries will allow for a variety of bonding mechanisms between the metal structure 10 and the organic layer 20. The formed bonds are expected to anchor between the silane groups and the metal surfaces as well as in plane cross linking which increases mono-layer stability. Although all the above-disclosed silane chemistries are effective to improve the adhesion between metal structure 10 and organic layer 20, for metal structures 10 comprising copper, the preferred amines may include the silane compositions numbered 1, 2, 3, 5, 7, 8, 9, 11, and 12 (in Table 1) and the sulphur-containing preferred compositions may include those numbered 4, 6, 11, and 12 in Table 1.

In some embodiments, the surface of the metal structure 10 may be treated with one or more of the above-described silane chemistries using a vapor phase silane deposition process. In some embodiments of an exemplary vapor phase silane deposition process, a vapor of the desired silane chemistry is introduced into a process chamber that supports therein a substrate (e.g., package substrate 40 of FIG. 1B) with an exposed metal structure 10. The process chamber of any suitable semiconductor process apparatus may be used for the vapor phase silane deposition process. For example, the process chamber of the process apparatus described in any of U.S. Pat. Nos. 7,727,588; 8,252,375; 8,361,548; 10,147,617; 10,319,612; 10,490,431; 11,367,640; 11,444,053; 11,335,662; 11,296,049; 11,456,274; and 11,465,225 may be used. Each of these references is incorporated in its entirety herein. In some embodiments, the temperature and pressure of the vapor in the process chamber may be adjusted to keep the applied silane chemistry in its vapor phase. The exact values (or ranges) of temperature and pressure to keep the silane in its vapor phase depends on the applied silane chemistry and the application (e.g., the materials involved, etc.). In general, the metal structure 10 may be exposed to the silane vapor for any desired time (e.g., from about 3 minutes-2 hours). In some embodiments, the metal structure 10 may be exposed to the silane vapor for a period or time between about 10-30 mins, or about 15-20 mins. It some embodiments, a longer time may be used. A silane mono-layer may be formed during the initial stages (e.g., first 10-20 mins) of exposure. Increasing the exposure time may increase the density of the formed mono-layer.

Figure 2A:
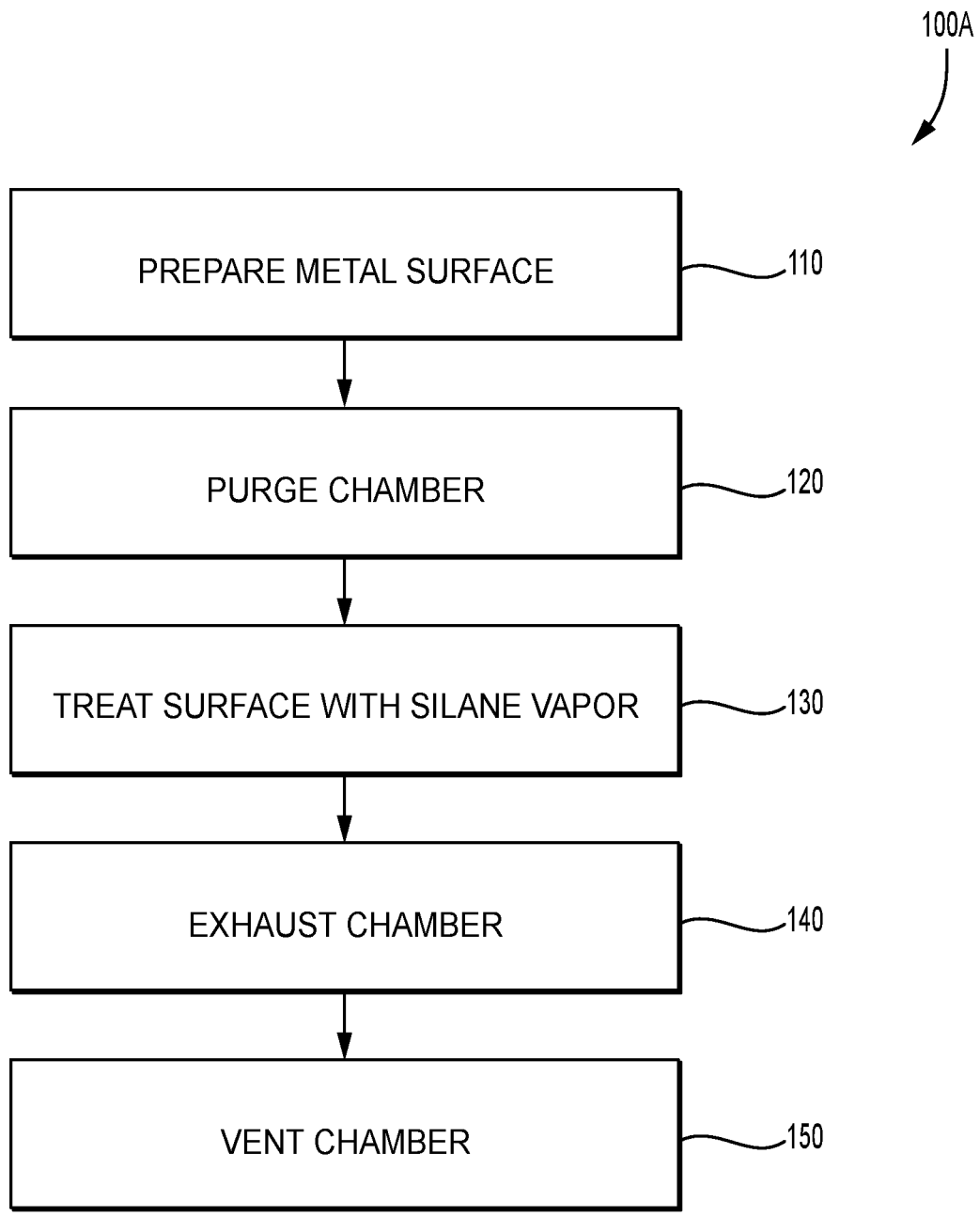
FIG. 2A is a flow chart of an exemplary method of treating the metal surface in the metal-oxide interface of FIG. 1A.

FIG. 2A is a flow chart of an exemplary process 100A that may be used to treat a substrate with the metal structure 10 formed thereon. One or more substrates with the metal structure 10 may be placed in a process chamber. The surface of the metal structure 10 and/or the substrate may be prepared for silane treatment (step 110). In some embodiments, the surface preparation may include a wet process, such as, for example, a dilute acid bath or exposing the surface to a dry active plasma to remove contaminants and native oxide from the surface. The process chamber may then be purged to remove oxygen and moisture (step 120). In some embodiments, as described in more detail in, for example, U.S. Pat. Nos. 7,727,588 and 8,252,375, the process chamber may be subjected to one or more successive vacuum and nitrogen purge cycles to create a relatively oxygen and moisture free environment in the process chamber. In some embodiments, heated nitrogen gas may be used. For example, in some embodiments, the process chamber may be subject to vacuum (e.g., about 10 Torr for 2 minutes, etc.) and then to room temperature nitrogen gas or heated nitrogen gas (e.g., at 150° C.), either once or multiple times to remove moisture and oxygen from the chamber. If heated nitrogen gas is used, the preheated nitrogen gas may also warm the surface of the substrate. In embodiments where it is desirable to not heat the substrate before the oxygen level is reduced to be below an acceptable level (e.g., <100 ppm), room temperature (or cooled) nitrogen gas may be used. Vapor of the desired silane composition (e.g., a composition listed in Table 1) may then be admitted into the process chamber (step 130). The chemical vapor injected into the chamber may be vaporized from a silane solution and then admitted into the process chamber or may be transported via inert carrier gas (such as, e.g., nitrogen). For example, heated nitrogen gas may be bubbled through liquid silane of the desired chemistry and then admitted into the process chamber. In some embodiments, the silane vapor of step 130 may be vaporized from pure liquid chemistry or may be vaporized from a solid or semi-solid chemistry. As explained previously, exposure time of the silane vapor to the substrate may be varied depending on the reaction rate of the substrate to achieve a dense mono-layer film. The temperature and pressure of the chamber may also be adjusted to keep the silane chemistry in vapor phase. After the metal structure 10 is exposed to the silane vapor for a sufficient time, the chamber may be evacuated to remove excess chemical vapor from the chamber (step 140). In some embodiments, similar to step 120, the process chamber may be alternately subject to vacuum and nitrogen gas one or more times to completely remove the chemical vapor from the chamber. In some embodiments, the chamber may then be vented to the atmosphere (step 150). After the metal structure 10 is treated with silane vapor, the organic layer 20 may be formed atop the treated metal structure 10 by any suitable process known in the art (e.g., deposition, etc.). In some embodiments, a conformal coating of the organic layer 20 may be deposited on the substrate surface with the metal structure 10.

Figure 2B:
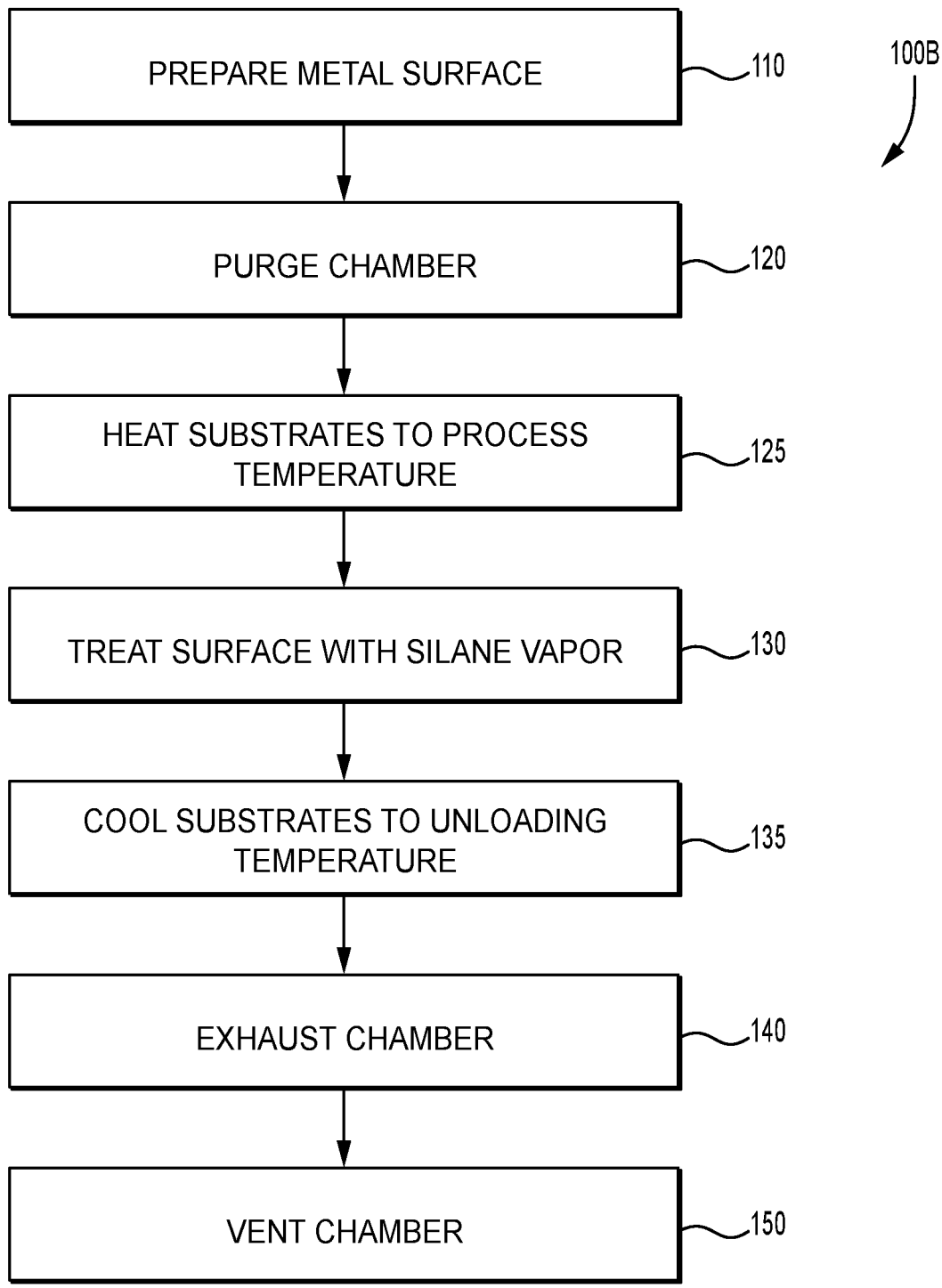
FIG. 2B is a flow chart of another exemplary method of treating the metal surface in the metal-oxide interface of FIG. 1A.

In some embodiments, the process of FIG. 2A may be used in process apparatuses which have a preheated chamber. In other embodiments of process apparatuses, the process chamber and/or the substrate may be heated from room temperature to process temperature before silane treatment (step 130) and then cooled down to a temperature safe for exposure to atmospheric oxygen (typically <100C). Such a process may be used to treat metals (e.g., copper) that are sensitive to oxygen. FIG. 2B is a flow chart of another exemplary process that may be used. Process steps of FIG. 2B that are similar to those described with reference to FIG. 2A are numbered similarly and are not described in detail. In process 100B of FIG. 2B, after purging the chamber (step 120) as described with reference to FIG. 2A, the process chamber and/or the substrates may be heated to the process temperature (step 125). The process temperature (e.g., 150° C., 175° C., 200° C., etc.) may depend on the process apparatus used. The metal surface is then treated with a vapor of the selected silane (step 130). The substrates are then cooled to a safe unloading temperature of, for example, less than about 100° C. (step 135). The chamber may then be exhausted (step 140) and vented (step 150). It should be noted that the processes illustrated in FIGS. 2A and 2B are only exemplary and many modifications are possible. For example, the described steps may be performed in a different order and some steps may be eliminated. For example, in process 100B of FIG. 2B, steps 135 and 140 may be interchanged (e.g., step 140 may be performed before step 135). In some embodiments, the processes 100A and 100B may be part of a larger process. For example, in some embodiments, process 100A or 100B may be incorporated in a process used to deposit an organic material on the metal structure.

When the metal structure 10 is exposed to the silane vapor in step 130, the silane chemistry may bond to the surface of metal structure 10. Although the silane may bond with the metal structure using any mechanism, in some embodiments where metal structure 10 includes copper, the silane chemistry may bond to the metal structure 10 using one or more of the mechanisms listed in Table 2 below.

TABLE 2

Exemplary bonding mechanisms.

| A | Hydrogen bonding | 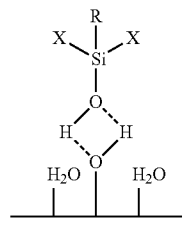 |
|---|---|---|
| B | Covalent Bonding via surface oxides | 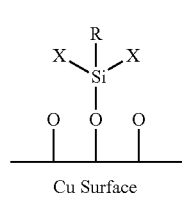 |

TABLE 2-continued

Exemplary bonding mechanisms.

| C | Chelation assisted amine bond | 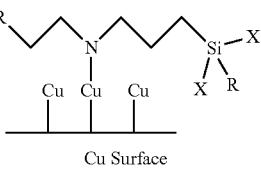 |
| --- | --- | --- |
| D | Coordination bond | 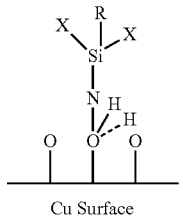 |
| E | Direct Sulfur/ Amine bond | 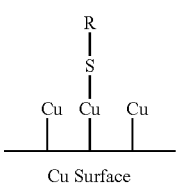 |

The surface of the copper metal structure 10 may be populated with Cu atoms or CuO molecules which result in the different bonding mechanisms as outlined above. The unique feature of the selected silane chemistries is that they can form covalent bonds in areas that are oxidized or chelated bonds in areas where the native oxide has been removed and only copper remains. This "dual functionality" holds whether the selected chemical is an amine or thiol functionality. Orientation of the molecule may change from one point to another on the surface, but the molecule will still bond. In some embodiments, each of these selected molecules will use all of the bonding mechanisms at various places on the surface.

Adhesion tests (peel tests) were conducted to evaluate the effect of treating an exemplary metal structure with exemplary disclosed silane chemistries of Table 1. Tests were conducted using a TMJ Peel Tester at a 90° peel angle and a peel rate of 50 mm/min. Table 3 below lists the details of some of the samples tested.

TABLE 3

Test samples and test conditions.

| Sample name (see FIG. 3) | Description of sample |
| --- | --- |
| Reference | Blanket sample no adhesion promotion silane treatment |
| Thermal 175 C. | Blanket sample that underwent thermal process 175 C. with no silane treatment |
| Thermal 200 C. | Blanket sample that underwent thermal process 200 C. with no silane treatment |
| AEAPTMS 175 C. | Blanket sample that underwent the disclosed silane treatment with silane chemistry 1 of Table 1 |
| TMSP-ED 175 C. | Blanket sample that underwent the disclosed silane treatment with silane chemistry 2 of Table 1 |

With reference to Table 3, in the sample labeled "AEAPTMS 175C," the process chamber (or the substrates) was heated to about 175° C. in a $N_2$ atmosphere, and after a period of stabilization (typically 2-30 min), the chamber was evacuated to base pressure and AE-APTMS silane vapor (silane chemistry 1 of Table 1) was introduced into the process chamber and the substrate exposed to the vapor for about 90 minutes. Similarly, for the sample labelled "TMSP-ED 175C," the process chamber/substrate was heated to 175° C., and the substrate was treated to the vapor of the silane chemistry 2 of Table 1. For the samples labeled "Thermal 175C" and "Thermal 200C," the substrates were heated to 175° C. and 200° C. respectively, held at that temperature and cooled without silane treatment. These samples served as control samples to separate the effect of heating the substrates on the surface properties (e.g. by dehydration) from the effect of silane reaction with the substrate surface. The "Reference" samples were not subject to a thermal process or to silane treatment and served as control samples. The test included samples with the copper layer formed by CCL (Copper Clad Laminate) and samples with the copper layer formed by PVD (Physical Vapor Deposition) to determine the effect of the silane composition on the surface of copper layers formed by different methods (e.g., CCL Cu and PVD Cu).

Figure 3A:
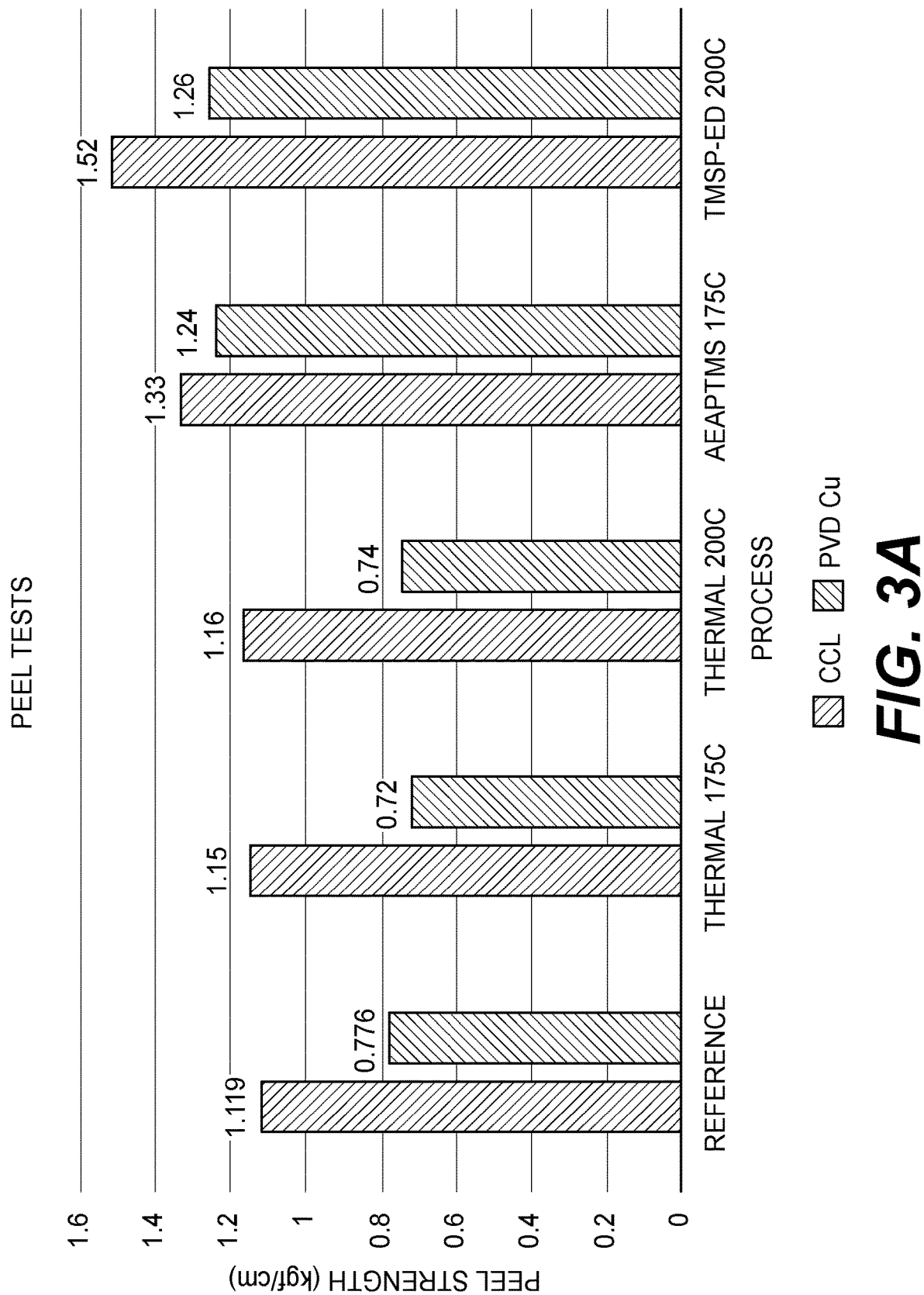
FIG. 3A shows the results of experiments conducted on samples representing exemplary embodiments of the current disclosure.
Figure 3B:
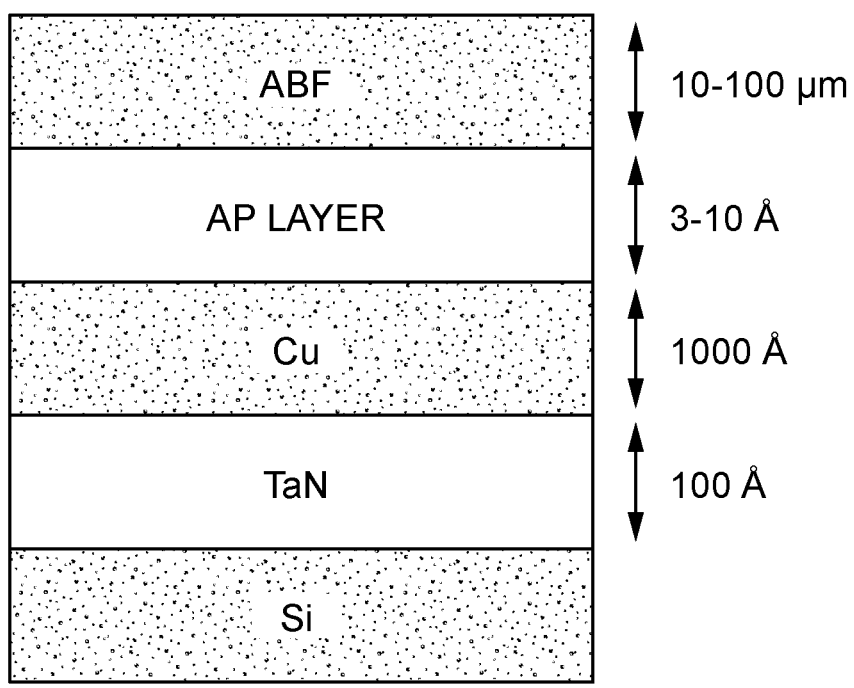
FIG. 3B is a schematic representation of the structure of the samples in the tests of FIG. 3A.

FIG. 3A summarizes the results of the peels tests, and FIG. 3B schematically illustrates the cross-sectional structure of the tested samples. In these samples, the interface tested was the copper-ABF interface. As seen in FIG. 3A, peel testing data shows successful adhesion promotion of ABF on both CCL Cu and PVD Cu surfaces. For example, comparison of the test results of the silane treated samples (e.g., "AEAPTMS 175C" and "TMSP-ED 175C" samples) with unprocessed samples (e.g., "Reference" sample) and thermally processed samples (e.g., "Thermal 175C" and "Thermal 200C" samples) indicate that the adhesion strength of the metal-organic interface increases as a result of the silane treatment. Failure analysis of the samples after testing confirms predictions and indicates that the silane treated samples failed by cohesive failure in the ABF layer while the samples that did not undergo silane treatment experienced adhesive failure at the copper-ABF interface thereby confirming the effectiveness of the disclosed silane treatment for improving adhesion. Although only the results of samples treated using silane chemistries 1 and 2 (of Table 1) on the copper surface of a Cu-ABF interface are described herein, predictions (e.g., based on the structure and chemistry of the listed silane compositions, the metal, the organic, etc.) indicate that all the above-described silane chemistries are expected to be effective in improving the adhesion of copper structures to other organic materials (build-up layers, dielectric layers, etc.) used in electronic devices.

Treating the surface of the metal structures 10 using the disclosed processes may increase the adhesion between the metal structure 10 and the organic layer 20 in an electronic device. This improvement in adhesion may result in the reduction of (or the elimination of) post etch delamination from the top and sidewalls of metal-organic interfaces that cause interfacial failure and reliability issues in electronic devices. Since the increase in adhesion is achieved without increasing the surface roughness of the metal structure 10, signal loss may also be eliminated.

Although the disclosed process is described with reference to an electronic device, this is only exemplary. As would be recognized by persons skilled in the art, embodiments of the disclosed methods may be used in other applications also. For example, embodiments of the disclosed methods may also be used for adhesion promotion of metal-organic interfaces in devices used in drug delivery, drug absorption, gas separation, lithium-ion batteries, $CO_2$ Capture, medical sensors, biological markers, wearable devices, etc. The disclosed silane treatment methods may be incorporated in any suitable process apparatus (e.g., process oven, vapor deposition systems, coating machines, etc.) Furthermore, although in the description above, some process steps were disclosed with reference to specific embodiments, a person skilled in the art would recognize that this is only exemplary, and these steps are applicable to all disclosed embodiments. Other embodiments of the disclosed methods will be apparent to those skilled in the art from consideration of the disclosure herein.

What is claimed is:

1. A method of improving the adhesion of a metal-organic interface in an electronic device, comprising:
    providing a substrate with a metal structure formed thereon;
    treating a surface of the metal structure with a vapor of a silane composition to deposit a silane mono-layer on the metal structure, wherein the silane composition includes at least one of
    (i.) N-(2-Aminoethyl)-3-aminopropyltrimethoxysilane (AE-APTMS),
    (ii.) N,N'-Bis[(3-trimethoxysilyl)propyl]ethylenediamine (TMSP-ED),
    (iii.) Bis(3-Trimethoxysilylpropyl)amine, (TMSPA),
    (iv.) 3-Mercaptopropyltrimethoxysilane (MPTMS),
    (v.) N-(2-Aminoethyl)-3-aminopropylsilanetriol, 25% in water (AE-APST),
    (vi.) 3-Thiocyanatopropyltriethoxysilane, 92% (TCPTES),
    (vii.) N-(6-Aminohexyl)aminomethyl trimethoxysilane,
    (viii.) 1,3-Bis(3-aminopropyl)tetramethyldisiloxane,
    (ix.) Bis[3-(triethoxysilyl)propyl]disulfide, 90% (TES-PDS),
    (x.) Cysteamine,
    (xi.) 3-Aminopropanethiol,
    (xii.) Aminoethylaminopropyl/methylsilsesquioxane, in aqueous solution,
    (xiii.) Aminopropylsilsesquioxane in aqueoussolution (APS),
    (xiv.) (2-Diethylphosphatoethyltriethoxysilane),
    (xv.) (2-Diethylphosphatoethyl)methyldiethoxysilane,
    (xvi.) N-(2-Aminoethyl)-3-Aminopropyltriethoxysilane,
    (xvii.) (3-(M-AMINOPHENOXY) PROPYLTRIMETHOXYSILANE,
    (xviii.) N-(2-Aminoethyl)-3-Aminopropylmethyldimethoxysilane,
    (xix.) N-(2-Aminoethyl)-3-Aminoisobutylmethyldimethoxysilane,
    (xx.) N-(2-Aminoethyl)-3-Aminoisobutyldimethylmethoxysilane,
    (xxi.) 4-Aminobutyltriethoxysilane,
    (xxii.) (Aminoethylaminomethyl)Phenethyltrimethoxysilane,
    (xxiii.) N-(2-Aminoethyl)-3-Aminopropylmethyldiethoxysilane,
    (xxiv.) N-(2-Aminoethyl)-11-Aminoundecyltrimethoxysilane,
    (xxv.) N-(6-Aminohexyl)Aminopropyltrimethoxysilane,
    (xxvi.) N-(6-Aminohexyl)Aminopropyltrimethoxysilane,
    (xxvii.) m-AMINOPHENYLTRIMETHOXYSILANE, or
    (xxviii.) m-AMINOPHENYLTRIMETHOXYSILANE; and
    after treating the surface of the metal structure, coating the treated surface with an organic material, wherein the metal-organic interface between the treated surface of the metal structure and the coated organic layer has improved adhesion.

2. The method of claim 1, wherein the silane composition includes at least one of
    (i.) N-(2-Aminoethyl)-3-aminopropyltrimethoxysilane (AE-APTMS),
    (ii.) N,N'-Bis[(3-trimethoxysilyl)propyl]ethylenediamine (TMSP-ED),
    (iii.) Bis(3-Trimethoxysilylpropyl)amine, (TMSPA),
    (v.) N-(2-Aminoethyl)-3-aminopropylsilanetriol, 25% in water (AE-APST),
    (vii.) N-(6-Aminohexyl)aminomethyl trimethoxysilane,
    ((xxv.)) N-(6-Aminohexyl)aminopropyltrimethoxysilane,
    (viii.) 1,3-Bis(3-aminopropyl)tetramethyldisiloxane,
    (x.) Cysteamine, or
    (xi.) 3-Aminopropanethiol.

3. The method of claim 1, wherein treating the surface of the metal structure includes depositing a mono-layer of the silane composition on the treated surface.

4. The method of claim 3, wherein the mono-layer is about 1 to 10 Angstroms thick.

5. The method of claim 1, wherein the silane composition has a boiling point below about 250° C. at a pressure between about 0.1-10 Torr.

6. The method of claim 1, wherein providing the substrate includes providing the substrate in a process chamber, and the method further includes purging the process chamber of oxygen or moisture prior to treating the surface with the vapor of the silane composition.

7. The method of claim 6, further includes purging the process chamber of the vapor of the silane composition after treating the surface with the vapor of the silane composition.

8. The method of claim 1, wherein the metal structure includes copper.

9. The method of claim 8, wherein the organic material includes ABF.

10. The method of claim 1, wherein the substrate is a part of a package substrate.

11. The method of claim 1, wherein the metal structure is an interconnect structure of the electronic device.

12. The method of claim 11, wherein the interconnect structure is one of an interconnect line, a power plane, a ground plane, a via, or a plated through hole.

13. A method of improving the adhesion of a metal-organic interface in an electronic device, comprising:
    providing a substrate with a copper interconnect structure;
    treating a surface of the copper interconnect structure with a vapor of a silane composition having a boiling point below about 250° C. at a pressure between about 0.1-10 Torr to deposit a silane mono-layer on the copper interconnect structure, wherein the silane composition includes at least one of
    (i.) N-(2-Aminoethyl)-3-aminopropyltrimethoxysilane (AE-APTMS),
    (ii.) N,N'-Bis[(3-trimethoxysilyl)propyl]ethylenediamine (TMSP-ED),
    (iii.) Bis(3-Trimethoxysilylpropyl)amine, (TMSPA),
    (iv.) 3-Mercaptopropyltrimethoxysilane (MPTMS),
    (v.) N-(2-Aminoethyl)-3-aminopropylsilanetriol, 25% in water (AE-APST),
    (vi.) 3-Thiocyanatopropyltriethoxysilane, 92% (TCPTES),
    (vii.) N-(6-Aminohexyl)aminomethyl trimethoxysilane,
    (viii.) 1,3-Bis(3-aminopropyl)tetramethyldisiloxane,
    (ix.) Bis[3-(triethoxysilyl)propyl]disulfide, 90% (TES-PDS), (x.) Cysteamine,
(xi.) 3-Aminopropanethiol,
(xii.) Aminoethylaminopropyl/methylsilsesquioxane, in aqueous solution,
(xiii.) Aminopropylsilsesquioxane in aqueoussolution (APS),
(xiv.) (2-Diethylphosphatoethyltriethoxysilane),
(xv.) (2-Diethylphosphatoethyl)methyldiethoxysilane,
(xvi.) N-(2-Aminoethyl)-3-Aminopropyltriethoxysilane,
(xvii.) (3-(M-AMINOPHENOXY) PROPYLTRIMETHOXYSILANE,
(xviii.) N-(2-Aminoethyl)-3-Aminopropylmethyldimethoxysilane,
(xix.) N-(2-Aminoethyl)-3-Aminoisobutylmethyldimethoxysilane,
(xx.) N-(2-Aminoethyl)-3-Aminoisobutyldimethylmethoxysilane,
(xxi.) 4-Aminobutyltriethoxysilane,
(xxii.) (Aminoethylaminomethyl)Phenethyltrimethoxysilane,
(xxiii.) N-(2-Aminoethyl)-3-Aminopropylmethyldiethoxysilane,
(xxiv.) N-(2-Aminoethyl)-11-Aminoundecyltrimethoxysilane,
(xxv.) N-(6-Aminohexyl)Aminopropyltrimethoxysilane,
(xxvi.) N-(6-Aminohexyl)Aminopropyltrimethoxysilane,
(xxvii.) m-AMINOPHENYLTRIMETHOXYSILANE, or
(xxviii.) m-AMINOPHENYLTRIMETHOXYSILANE; and
after treating the surface of the copper interconnect structure, coating the treated surface with an organic material, wherein the metal-organic interface between the treated surface of the copper interconnect structure and the coated organic material has improved adhesion.

14. The method of claim 13, wherein treating the surface includes forming a mono-layer of the silane composition on the treated surface.

15. The method of claim 13, wherein coating the treated surface with the organic material includes depositing the organic material on the treated surface.

16. The method of claim 13, wherein the substrate is a part of a package substrate and the copper interconnect structure is one of an interconnect line, a power plane, a ground plane, a via, or a plated through hole.

17. The method of claim 13, wherein the silane composition includes at least one of
(i.) N-(2-Aminoethyl)-3-aminopropyltrimethoxysilane (AE-APTMS),
(ii.) N,N'-Bis[(3-trimethoxysilyl)propyl]ethylenediamine (TMSP-ED),
(iii.) Bis(3-Trimethoxysilylpropyl)amine, (TMSPA),
(v.) N-(2-Aminoethyl)-3-aminopropylsilanetriol, 25% in water (AE-APST),
(vii.) N-(6-Aminohexyl)aminomethyl trimethoxysilane,
((xxv.)) N-(6-Aminohexyl)aminopropyltrimethoxysilane,
(viii.) 1,3-Bis(3-aminopropyl)tetramethyldisiloxane,
(x.) Cysteamine, or
(xi.) 3-Aminopropanethiol.

18. A method of improving the adhesion of a metal-organic interface in an electronic device, comprising:
providing a substrate with a copper interconnect structure;
depositing a mono-layer of a silane composition on a surface of the copper interconnect structure by vapor phase deposition, wherein the silane composition includes (a) at least a primary amine group or a secondary amine group and at least one alkoxysilyl group, (b) the alkoxysilyl group may be one of ethoxy, methoxy, butoxy, propoxy, or isopropoxy, (c) the alkoxysilyl group may have between one and three alkoxy groups attached, and (d) a boiling point below about 250° C. at a pressure between about 0.1-10 Torr; and
depositing an organic material on the surface of the copper interconnect structure after depositing the mono-layer of the silane composition, wherein the metal-organic interface between the copper interconnect structure and the deposited organic material has improved adhesion.

19. The method of claim 18, wherein the silane composition includes at least one of
(i.) N-(2-Aminoethyl)-3-aminopropyltrimethoxysilane (AE-APTMS),
(ii.) N,N'-Bis[(3-trimethoxysilyl)propyl]ethylenediamine (TMSP-ED),
(iii.) Bis(3-Trimethoxysilylpropyl)amine, (TMSPA),
(iv.) 3-Mercaptopropyltrimethoxysilane (MPTMS),
(v.) N-(2-Aminoethyl)-3-aminopropylsilanetriol, 25% in water (AE-APST),
(vi.) 3-Thiocyanatopropyltriethoxysilane, 92% (TCPTES),
(vii.) N-(6-Aminohexyl)aminomethyl trimethoxysilane,
(viii.) 1,3-Bis(3-aminopropyl)tetramethyldisiloxane,
(ix.) Bis[3-(triethoxysilyl)propyl]disulfide, 90% (TES-PDS),
(x.) Cysteamine,
(xi.) 3-Aminopropanethiol,
(xii.) Aminoethylaminopropyl/methylsilsesquioxane, in aqueous solution,
(xiii.) Aminopropylsilsesquioxane in aqueous solution (APS),
(xiv.) (2-Diethylphosphatoethyltriethoxysilane),
(xv.) (2-Diethylphosphatoethyl)methyldiethoxysilane,
(xvi.) N-(2-Aminoethyl)-3-Aminopropyltriethoxysilane,
(xvii.) (3-(M-AMINOPHENOXY)PROPYLTRIMETHOXYSILANE,
(xviii.) N-(2-Aminoethyl)-3-Aminopropylmethyldimethoxysilane,
(xix.) N-(2-Aminoethyl)-3-Aminoisobutylmethyldimethoxysilane,
(xx.) N-(2-Aminoethyl)-3-Aminoisobutyldimethylmethoxysilane,
(xxi.) 4-Aminobutyltriethoxysilane,
(xxii.) (Aminoethylaminomethyl)Phenethyltrimethoxysilane,
(xxiii.) N-(2-Aminoethyl)-3-Aminopropylmethyldiethoxysilane,
(xxiv.) N-(2-Aminoethyl)-11-Aminoundecyltrimethoxysilane,
(xxv.) N-(6-Aminohexyl)Aminopropyltrimethoxysilane,
(xxvi.) N-(6-Aminohexyl)Aminopropyltrimethoxysilane,
(xxvii.) m-AMINOPHENYLTRIMETHOXYSILANE, or
(xxviii.) m-AMINOPHENYLTRIMETHOXYSILANE.

20. The method of claim 19, wherein the silane composition includes at least one of
(i.) N-(2-Aminoethyl)-3-aminopropyltrimethoxysilane (AE-APTMS),
(ii.) N,N'-Bis[(3-trimethoxysilyl)propyl]ethylenediamine (TMSP-ED),
(iii.) Bis(3-Trimethoxysilylpropyl)amine, (TMSPA),
(v.) N-(2-Aminoethyl)-3-aminopropylsilanetriol, 25% in water (AE-APST),
(vii.) N-(6-Aminohexyl)aminomethyl trimethoxysilane,
((xxv.)) N-(6-Aminohexyl)aminopropyltrimethoxysilane,
(viii.) 1,3-Bis(3-aminopropyl)tetramethyldisiloxane,
(x.) Cysteamine, or
(xi.) 3-Aminopropanethiol.

* * * * *